United States Patent [19]

Tanner et al.

[11] 4,268,805
[45] May 19, 1981

[54] CITIZENS BAND BROADCAST BAND COUPLING CIRCUIT

[75] Inventors: James L. Tanner, Reseda; Bruno A. Rist, Northridge; George Sanchez, Los Angeles, all of Calif.

[73] Assignee: Tanner Electronic Systems Technology, Inc., Van Nuys, Calif.

[21] Appl. No.: 724,797

[22] Filed: Sep. 20, 1976

[51] Int. Cl.³ .......................... H01P 5/16; H01Q 1/50
[52] U.S. Cl. ..................................... 333/129; 334/74; 343/711; 343/858; 343/861; 455/140
[58] Field of Search ............... 343/175, 176, 180, 715, 343/850, 852, 858, 860, 861; 333/8, 100, 124, 129, 132; 334/74, 76; 455/140

[56] References Cited

U.S. PATENT DOCUMENTS

| | | | |
|---|---|---|---|
| 2,628,312 | 2/1953 | Peterson et al. | 343/858 |
| 2,672,555 | 3/1954 | Ehrbar | 334/74 X |
| 3,424,983 | 1/1969 | Schilb | 343/850 X |
| 3,465,344 | 9/1969 | Scott et al. | 343/852 |
| 3,725,942 | 4/1973 | Ukmar | 343/858 X |
| 4,037,177 | 7/1977 | Tyrey | 343/858 X |

OTHER PUBLICATIONS

Friedman, *Antenna Duplexer*, Electronics Illustrated, Mar. 1962, pp. 66, 67, 108, 110.

*Primary Examiner*—Paul L. Gensler
*Attorney, Agent, or Firm*—Herzig & Walsh

[57] ABSTRACT

A circuit for coupling a citizens band transceiver and a broadcast band receiver to a standard automobile antenna. The circuit is comprised of an impedance transforming network connected in series with the standard automobile antenna and a parallel-tuned circuit in series with the broadcast band receiver. The series-tuned network is comprised of a split capacitance for stepping the impedance down from the citizens band transceiver to the lower impedance of a standard automobile antenna. The series-tuned circuit also includes a tuning coil for matching the output of the network to the particular automobile antenna. In series between the automobile antenna and the broadcast band receiver is a parallel-tuned circuit comprised of a capacitor and a tuning coil. To prevent multiplication and excessive voltages in the event the broadcast band receiver should become disconnected, a limiting resistor connects the parallel-tuned circuit to ground. The tuning coil of the impedance transforming network has a novel molded plastic tuning knob for simplifying tuning of the circuit.

1 Claim, 6 Drawing Figures

CITIZENS BAND BROADCAST BAND COUPLING CIRCUIT

BACKGROUND OF THE INVENTION

This invention relates to coupling networks and more particularly relates to a circuit for coupling a citizens band transceiver and a broadcast band receiver to a standard antenna.

At present citizens band transceivers, when installed in a motor vehicle, require some type of special antenna in order to receive and transmit in the 27 MHz band. These antennas are sometimes known as whip antennas and are very distinctive, allowing anyone instant knowledge that the vehicle is equipped with a citizens band transceiver. The only presently known methods of concealing the fact that a vehicle is equipped with a citizens band transceiver is by utilizing a readily removable antenna. This is awkward and inconvenient because of the time involved and a special mounting is necessary for connecting and disconnecting. Further, when the vehicle is in motion, the antenna may not be utilized unless it has been previously connected.

Because of the great potential for theft, various other equipment and methods have been proposed and tried in order to protect the equipment. These involve lockable brackets, or brackets from which the unit is readily removable. While these are also of some help, they are not entirely satisfactory, requiring frequent removal and reinstallation of the equipment. Further, removal for concealed storage may be a disadvantage or impractical at a time when needed.

For this reason it would be desirable if the fact that a citizens band transceiver is installed in a vehicle could be concealed. To accomplish this, it would be desirable if the citizens band antenna could be available for use at any time, yet be hidden or concealed in some manner.

SUMMARY OF THE INVENTION

The purpose of the present invention is to utilize a standard automobile antenna for citizens band use in order to conceal the fact that a vehicle is equipped with citizens band components.

The present invention is comprised of a coupling circuit for coupling the citizens band transceiver and a broadcast band receiver to the same or standard automobile antenna. This permits use of the standard automobile antenna for citizens band radio, concealing the fact that a vehicle has citizens band components.

The broadcast band receiver must, however, be isolated from the output when the citizens band equipment is transmitting. Thus, the circuit has a parallel-tuned isolation circuit which includes a resistor for limiting the amount of voltage built up in the parallel-tuned isolation network. The citizens band transceiver is connected to the anenna by an impedance transforming network comprised of a split capacitance for stepping down the output impedance to match the impedance of the antenna and a specially constructed tuning coil permitting tuning manually for peak resonance. The impedance transformation network and isolation networks permit peak performance by allowing each circuit to be tuned to match the citizens band transceiver and the broadcast band receiver to operate with the standard automobile antenna. The circuit is uniquely designed to be compatible with the usual broadcast band receiver trimmer.

It is one object of the present invention to provide a coupling circuit allowing a citizens band transceiver and broadcast band receiver to be simultaneously connected to the standard automobile antenna.

Another object of the present invention is to provide a coupling circuit for simultaneously connecting a citizens band transceiver and broadcast band receiver to a standard automobile antenna while isolating the broadcast band receiver from energy transmissions from the citizens band transceiver.

Another object of the present invention is to provide a coupling circuit for connecting a citizens band transceiver and broadcast band receiver to a standard automobile antenna which permits easy tuning for maximum power transfer.

Still another object of the present invention is to provide a coupling circuit for a citizens band transceiver and a broadcast band receiver which incorporates an integral molded tuning tool.

Other objects, advantages and novel features of the invention will become apparent from the following detailed description of the invention when consideed in conjunction with accompanying drawings.

DETAILED DESCRIPTION OF THE PREFERRED EMBODIMENT

The coupling circuit of the invention facilitates CB transceiving use on the typical car radio antenna, simultaneously with AM-FM radio use. The circuitry provides isolation between the CB transceiver and the input to the car radio, yet passes AM broadcasts and FM signals right on through to the radio. In addition, the coupling circuitry provides an impedance match from the typical 50 ohm CB output to the standard car antenna.

Figure 1:
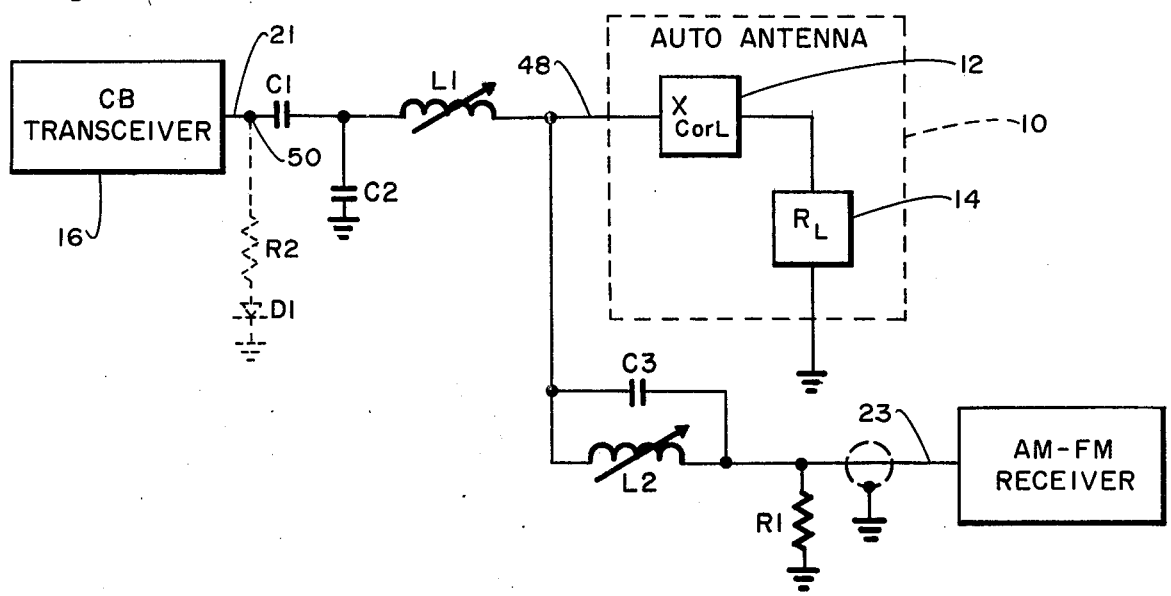
FIG. 1 is a schematic diagram of a coupling circuit of the invention.

It was found that the electrical characteristics of a standard car antenna vary greatly at the 27 MHz of the CB band, depending upon location, height, type of lead-in, etc. In some cases the antenna is inductive and in other capacitive, which is represented by the block 10 representing an auto antenna having a reactance 12 and a resistance 14 as depicted in FIG. 1. A series equivalent circuit is used for coupling because the imaginary component simply becomes part of the series circuit. The CB transceiver 16 has a split capacitance input circuit of C1 and C2 which provides an impedance step-down from 50 ohm to 5 ohm. Also, included in the circuit is a coil L1 tunable over a wide range to accommodate the various capacitive antennas and achieve resonance which is important for proper operation.

In an automobile AM receiver the antenna is an integral part of the receiver front-end tuned circuit and should also be resonant to operate satisfactorily. Normally the AM receiver has a trimmer capacitor which is adjusted with the antenna attached for maximum output on a weak station. Stray reactances are cancelled out in this manner. However, since the range of the trimmer is somewhat limited, the impedance transformation network of capacitor C1 and C2 and coil L1 must be carefully designed to permit the radio trimmer to tune out the worst case capacitive load. This constraint dictates the Q of the circuit which satisfies the limits of the AM trimmer while simultaneously achieving the needed impedance transformation for the CB transceiver. At broadcast frequencies the coil or inductor L1 is virtually a low impedance conductor with the consequence of the AM signals being shunted by C1 and C2.

The AM-FM receiver 18 is connected to the auto antenna 10 through a series connected parallel-tuned circuit comprised of capacitor C3 and coil or inductor L2. This circuit provides isolation from the 27 MHz transmitted energy from the CB transceiver 16. The coil L2 is tuned slightly above the 27 MHz CB band (about 27.43 MHz) so that it wil end up resonant in the center of the CB band after encapsulation, which will be more fully described hereinafter. The resistor R1 is provided to insure against excess voltage in the isolation network of C3 and L2 which might be generated by Q multiplication if the AM-FM receiver were not connected or inadvertently disconnected. The AM-FM receiver is connected to the coupling circuit by shielded cable 23.

Figure 2:
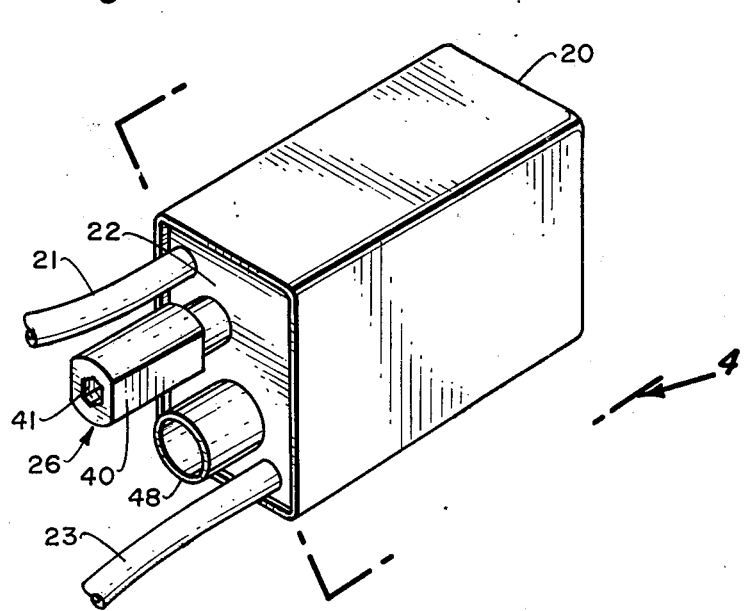
FIG. 2 illustrates the encapsulation of the circuit with the integral tuning tube.
Figure 4:
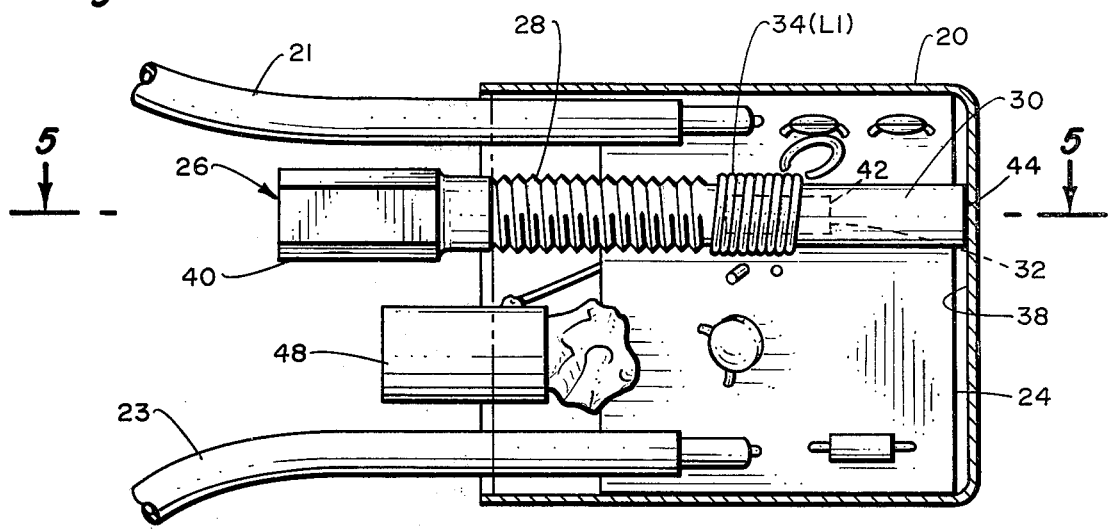
FIG. 4 is a sectional view along the line 4—4 of the invention depicted in FIG. 2.
Figure 5:
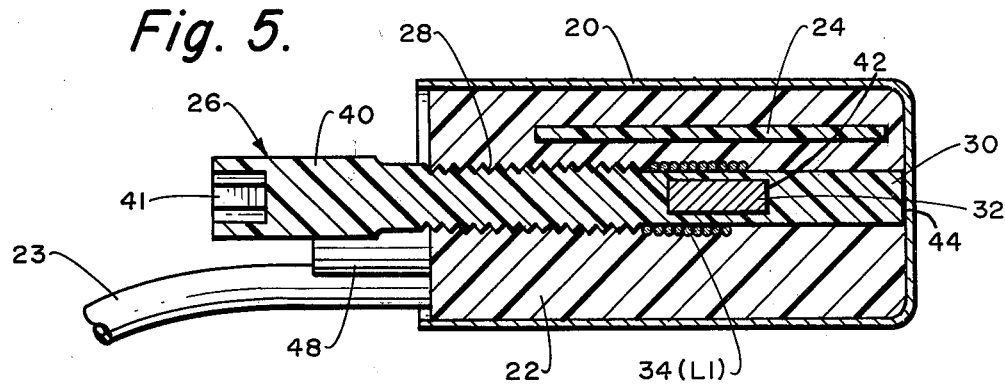
FIG. 5 is a sectional view of the invention depicted in FIG. 4, taken along the line 5—5.
Figure 6:
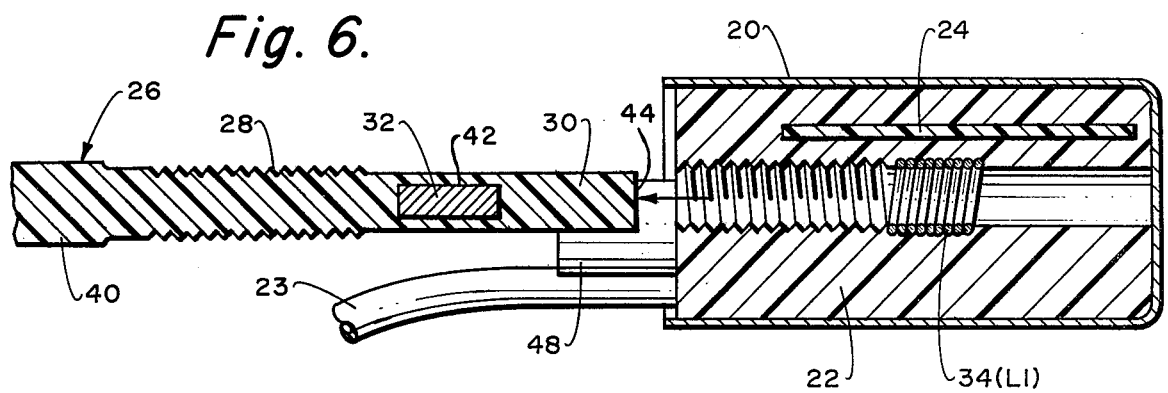
FIG. 6 is a sectioal view of the invention depicted in FIG. 5, partially disassembled.

The coupling circuit is mounted on a small circuit board and installed in a can 20 as shown in FIG. 2. The can 20 is then filled with an epoxy 22 encapsulating the circuit board 24 (FIG. 4). The shielded cables 21 and 23 are for connecting the CB transceiver and the AM-FM receiver respectively while a socket 48 is provided for connecting the automobile antenna 10.

In order to adapt the coupling circuit for use with a variety of automobile antennas, a novel tuning tool 26 is encapsulated by the epoxy 22, along with the circuit board 24 as depicted in FIGS. 2 through 6, inclusive. The tuning tool 26 has an elongate threaded body 28 terminating in a narrow tapering shank 30. The shank is hollow for receiving a tuning slug 32 for tuning the coil 34 or L1. The shank 30 passes through the tuning coil 34 and engages the bottom 38 of the can 20. When the circuit board 24 is encapsulated by the epoxy 22, the tuning tool 26 is automatically encapsulated with it forming threads 28 in the epoxy material 22. After the epoxy material 22 hardens, the tuning tool 26 is partially withdrawn from the coil with the tapering portion of the shank 30 then releasing. This allows the coupling circuit to be easily tuned to match any type of antenna without the necessity for providing a separate tuning tool which is sometimes difficult for the layman to use.

Figure 3:
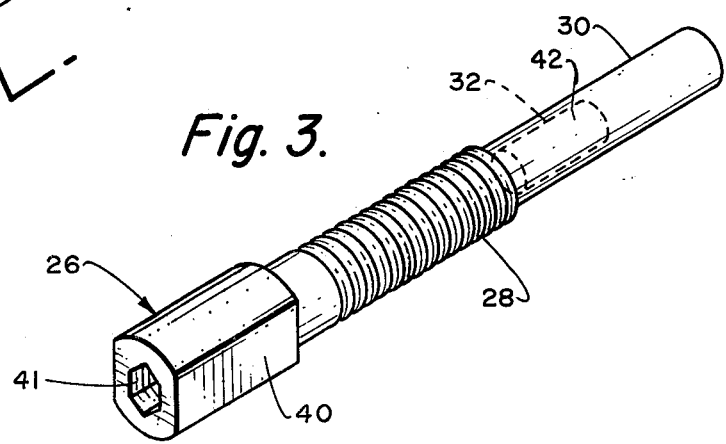
FIG. 3 is a diagram of the tuning tool for encapsulation with the coupling circuit.

In FIG. 3 the tuning tool 26 is shown in greater detail. The tuning tool is made of a plastic or molded nylon having a square or flat-sided tuning knob 40, a threaded portion 28, and a tapering shank 30. The shank 30 is provided with a cavity 42 for installation of the tuning slug 32, as shown in FIGS. 3 through 6, inclusive. The tuning slug 32 is installed in the shank 30 of the tuning tool 26 and the end is then sealed. The shank 30 of the tuning tool is then inserted through the hollow diameter of the coil 34 with the end 44 of the tuning tool engaging the bottom 38 of the can 20. When the circuit board 24 is encapsulated along with the tuning tool 26, threads are formed in the encapsulating material 22 by the threads 28. After the encapsulating epoxy material 22 hardens, the tuning tool 26 may then be slightly withdrawn by rotation counterclockwise, freeing the tapered end from the epoxy. This permits easy tuning of the coil 34 after installation of the coupling circuit of an automobile. A hexagonal socket 41 (or screw driver slot) may be also included in the knob 40 for tuning with a long-shank tool when the knob is inaccessible.

To install and use the coupler, the antenna lead is removed from the radio and plugged into socket 48. Cable 23 is then plugged into the car radio and cable 21 is then connected to the CB transceiver with a suitable threaded connector (not shown). With the antenna extended, the CB transceiver is turned on and tuned to a mid-channel having a weak signal. The tuning tool knob 40 is then adjusted for the strongest reception. The CB tansmitter is then activated and the tuning knob 40 adjusted for maximum vertical standing wave ratio (VSWR).

To aid in the latter adjustment, the circuit of FIG. 1 can be modified to provide an indicator. This is done by connecting an indicating device D1 through resistor R2 between C1 and the CB transceiver 16. When L1 is tuned, the indicator D1 permits visual indication of minimum VSWR. Preferably D1 is a light-emitting diode (LED) which will be at minimum intensity or extinguished when L1 is tuned. When L1 is mistuned, the voltage at 50 increases (due to VSWR) and illuminates D1. Proper tuning minimizes the voltage at 50 to dim or extinguish the light D1.

Obviously, many modifications and variations of the present invention are possible in light of the above teachings. It is therefore to be understood that the full scope of the invention is not limited to the details disclosed herein and may be practiced otherwise than as specifically described.

What is claimed is:

1. A circuit for coupling a citizens band transceiver and an AM-FM receiver to a standard automobile antenna comprising:

impedance transforming means for matching the citizens band output impedance to the antenna impedance, said impedance transforming means comprising a series tuned network of a split capacitance providing an impedance step-down and a tuning coil;

isolation means connecting the AM-FM receiver to said antenna for isolating the AM-FM receiver from CB transmission energy, said isolation means comprising a parallel tuned circuit in series with the AM-FM radio and further including means for limiting the voltages in said isolation means; and integral tuning means for manually tuning said coil, said integral tuning means comprising encapsulating means for encapsulating said circuit, an elongate molded plastic tuning knob having central threads embedded in said encapsulating means to form a threaded socket, said tuning knob having a hollow shank extending through the tuning coil and said integral tuning means further including a tuning slug secured in said hollow shank.

* * * * *